United States Patent
Fazan et al.

[11] Patent Number: 5,084,405
[45] Date of Patent: Jan. 28, 1992

[54] PROCESS TO FABRICATE A DOUBLE RING STACKED CELL STRUCTURE

[75] Inventors: Pierre Fazan; Hiang C. Chan; Chuck H. Dennison; Howard E. Rhodes; Yauh-Ching Liu, all of Boise, Id.

[73] Assignee: Micron Technology, Inc., Boise, Id.

[21] Appl. No.: 712,308

[22] Filed: Jun. 7, 1991

[51] Int. Cl.$^5$ ............................................ H01L 21/70
[52] U.S. Cl. .................................. 437/52; 437/47; 437/48; 437/60; 437/228; 437/233; 437/919; 357/23.6
[58] Field of Search ................ 437/47, 48, 51, 52, 437/60, 228, 233, 235, 919; 357/23.6, 51; 365/149

[56] References Cited

U.S. PATENT DOCUMENTS 4,742,018 5/1988 Kimura et al. ................ 437/48

FOREIGN PATENT DOCUMENTS 0074752 3/1989 Japan .
0129956 5/1990 Japan .
0260453 10/1990 Japan .
0260454 10/1990 Japan .

OTHER PUBLICATIONS

"A Stacked Capacitor Cell with Ring Structure", Shinmura et al., Ext. Abs. of the 22nd Int. Conf. on Solid State Device and Materials, 1990, pp. 833–836.
"Novel Stacked Capacitor Cell for 64Mb Dram", Wakamiya et al., pp. 69–70, Symp. on ULSI Tech., 1989.
"Crown-Shaped Stacked-Capacitor Cell for 1.5 V Operation 64 Mb DRAM's", IEEE Tran. Elec. Dev., pp. 255–261, 1991.

Primary Examiner—Brian E. Hearn
Assistant Examiner—Tom Thomas
Attorney, Agent, or Firm—David J. Paul

[57] ABSTRACT

An existing stacked capacitor fabrication process is modified to construct a three-dimensional stacked capacitor, referred to as a Double Ring Stacked Cell or DRSC. The DRSC design defines a capacitor storage cell that in the present invention is used in a DRAM process. The DRSC is made up of a polysilicon storage node structure having circular polysilicon ringed upper portion centered about a lower portion that makes contact to an active area via a buried contact. The polysilicon storage node structure is overlaid by polysilicon with a dielectric sandwiched in between to form a completed DRSC capacitor. The novel 3-dimensional shaped polysilicon storage node plate having double polysilicon rings, allows substantial capacitor plate surface area of 200% or more to be gained at the storage node over that of a conventional STC.

27 Claims, 12 Drawing Sheets

PROCESS TO FABRICATE A DOUBLE RING STACKED CELL STRUCTURE

FIELD OF THE INVENTION

This invention relates to semiconductor circuit memory storage devices and more particularly to a process for fabricating three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining good dielectric breakdown characteristics between poly layers in the STC capacitor becomes a major concern once insulator thickness is appropriately scaled.

A paper submitted by N. Shinmura, et al., entitled "A Stacked Capacitor Cell with Ring Structure," Extended Abstracts of the 22nd International Conference on Solid State Devices and Materials, 1990, pp. 833-836, herein incorporated by reference, discusses a 3-dimensional stacked capacitor incorporating a ring structure around the main electrode to effectively double the capacitance of a conventional stacked capacitor.

The ring structure and its development is shown in FIGS. 1(c) through 1(g), pp. 834 of the article mentioned above. FIG. 1(a), on the same page shows a bird's eyeview of storage electrodes. The storage node is formed by two polysilicon layers that form a core electrode encircled by a ring structure. Capacitor dielectric film surrounds the whole surface of the storage node electrode and then is covered with a third polysilicon layer to form the top capacitor electrode and completes the storage cell. This design can be fabricated using current methods and increases storage capacitance by as much as 200%. However, the process flow needed to realize this ring capacitor structure requires precise alignment between two adjacent word lines and digits lines.

The present invention develops an existing stacked capacitor fabrication process without adding any photolithography step to construct a three-dimensional double ring stacked capacitor cell. The capacitor's bottom plate (or storage node plate) is centered over the buried contact (or node contact) connected to an access transistor's active area. The buried contact may be self-aligned depending on the process approach selected in the present invention. Additionally, the storage node does not need to be critically aligned on the node contact which allows the manufacture of a smaller cell area for a given lithographic resolution.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional double ring stacked capacitor, referred to hereinafter as a Double Ring Stacked Cell or DRSC. The DRSC design defines a capacitor storage cell that in the present invention is used in a DRAM process, however it will be evident to one skilled in the art to incorporate these steps into other processes requiring memory cells such as VRAMs or the like.

After a silicon wafer is prepared using conventional process steps, the present invention develops the DRSC by depositing and patterning two interconnecting layers of polysilicon separating at specific areas to form the storage node structure having a double ringed, circular shape centered about the storage node's buried contact. The double ring polysilicon structure results in increased capacitor plate surface area for each storage cell. Such a structure is a vast improvement over the conventional STC cell by maximizing the area available for a storage node.

DETAILED DESCRIPTION OF THE PREFERRED EMBODIMENT

The invention is directed to maximizing storage cell surface area in a high density/high volume DRAM fabrication process, in a sequence shown in FIGS. 1–10.

A silicon wafer is prepared using conventional process steps up to the point of defining a cell array. Fabrication of word lines, digit lines and a capacitor cell of the present invention will now follow.

The capacitor of each cell will make contact with a buried contact within the cell and aligned directly to its associated buried contact. Each active area within the array is isolated from one another by a thick field oxide. The active areas can be arranged in interdigitated columns and non-interdigitated rows or simply parallel and in line to one another in both the vertical and horizontal directions. The active areas are used to form active MOS transistors that can be doped as NMOS or PMOS type FETs depending on the desired use.

Figure 1:
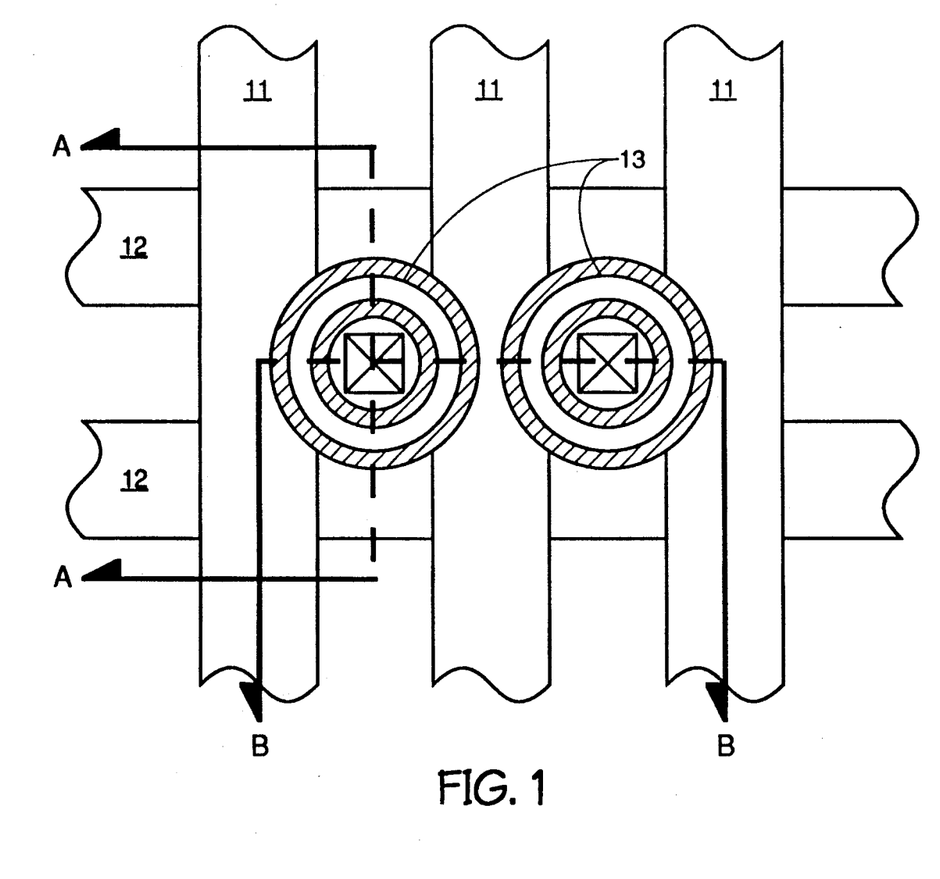
FIG. 1 is a top planar view of a portion of an in-process wafer showing digit lines, word lines and storage capacitors.

FIG. 1 shows a top planar view portion of a completed multilayered memory array with the main building blocks comprising digit lines 11, word lines 12 and a storage node plate 13 of an DRSC capacitor.

Figure 2:
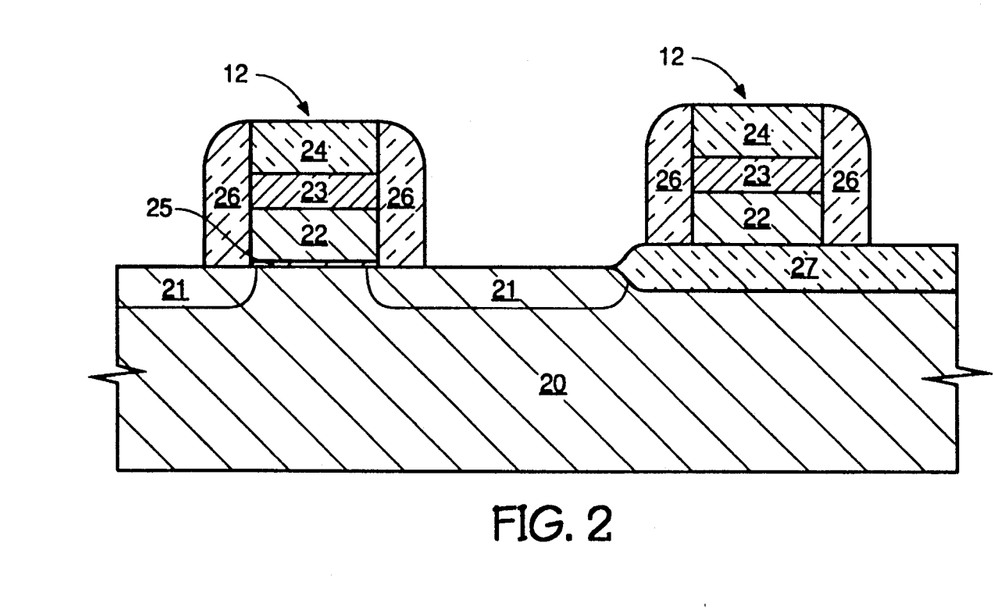
FIG. 2 is a cross-sectional view through broken line A—A of FIG. 1.

As shown in FIG. 2, poly 22, covered with silicide 23 and dielectric 24 (either oxide or nitride) are patterned to serve as word lines 12. Silicide 23 may be selected from such silicides as tungsten silicide ($WSi_2$), titanium silicide ($TiSi_2$) or the like. Poly 22 is conductively doped in order to combine with silicide 23 to form the conductor for word lines 12. Word lines 12 are further isolated from one another as well as subsequent conductive layers by dielectric spacers 26 (also either oxide or nitride). Word lines 12 have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to and over word lines 12.

Figure 3:
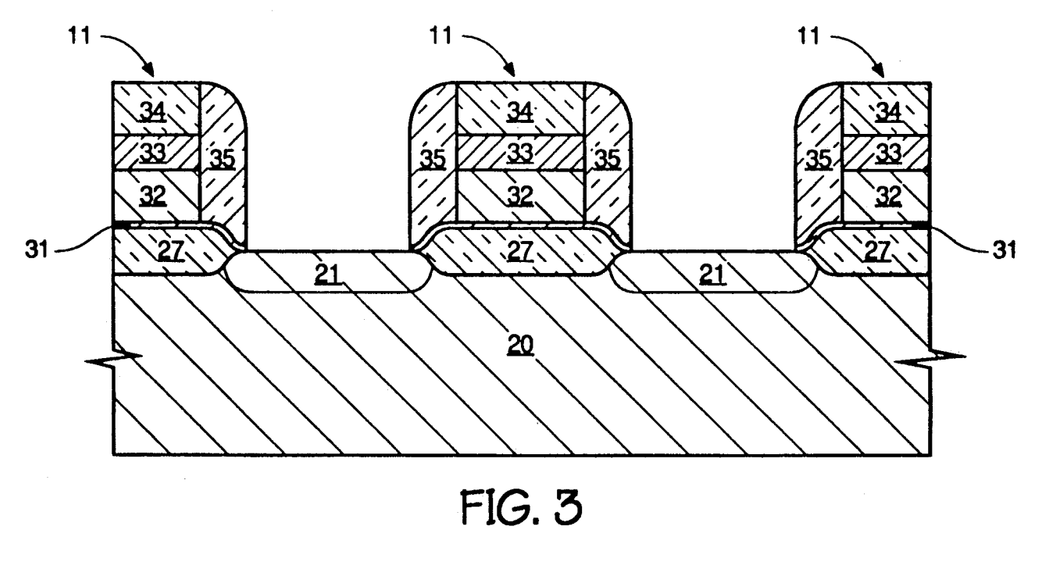
FIG. 3 is a cross-sectional view through broken line B—B of FIG. 1.

FIG. 3 shows the formation of digit lines 11. A conformal layer of dielectric 31 is deposited over the existing wafer surface to isolate previously formed active areas 21 from the subsequent formation of digit lines 11. First, buried digit line contacts are patterned and etched through dielectric 31 allowing access to active areas 21 at the desired locations (the buried digit line contacts cannot be seen in the cross-section of FIG. 3). Second, digit lines 11 are made up of patterned layers consisting of polysilicon 32, silicide 33 and dielectric 34 following the location of the buried digit line contacts. Dielectric 34 can be either nitride or oxide and is deposited by chemical vapor deposition (CVD) which is preferred for its excellent conformity. Polysilicon 32 has previously been conductively doped to electrically couple with silicide 33 to serve as the conductor for digit lines 11. Silicide 33 may be selected from such silicides as tungsten silicide ($WSi_2$), titanium silicide ($TiSi_2$) or the like. Digit lines 11 run perpendicular to and over the top of word lines 12 (shown in FIG. 2) and conform to the wafer surface resulting in a waveform-like topology running in both the digit line and word line directions. A second dielectric, such as nitride or oxide is now deposited, followed by an anisotropic etch to form vertical dielectric spacers 35.

Figure 4A:
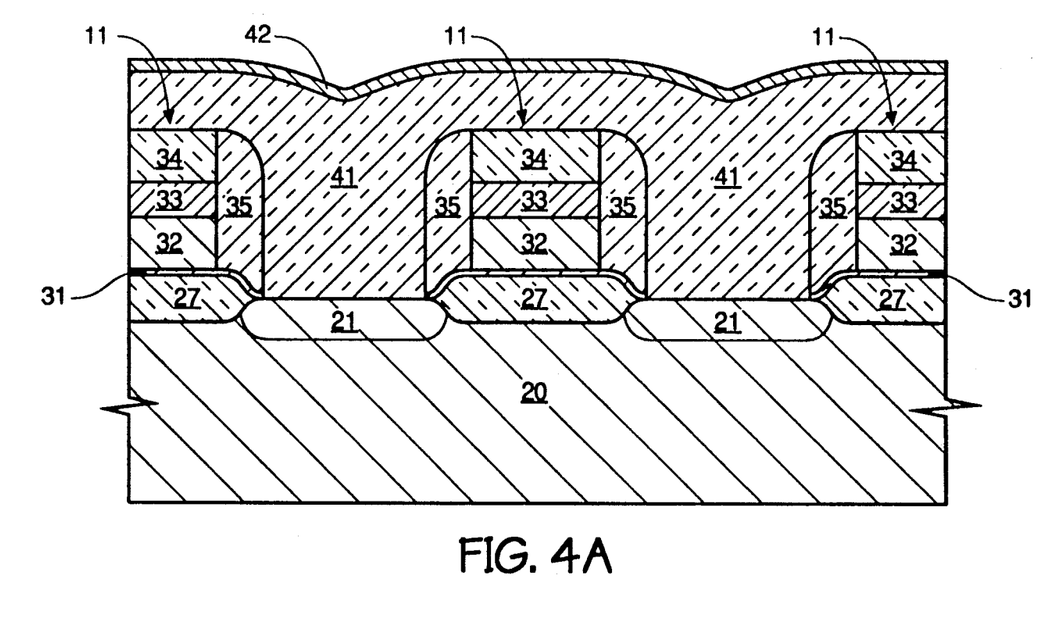
FIG. 4a is a cross-sectional view of the in-process wafer portion of FIG. 3 after a conformal deposition of a thick oxide and planarization followed by a conformal deposition of thin nitride.

As shown in FIG. 4a, digit lines 11 and their subsequent isolation layers are then covered with a thick layer of oxide 41, preferably by CVD. Following dielectric 41 deposition, a conformal layer of thin nitride 42 is then deposited.

Figure 4B:
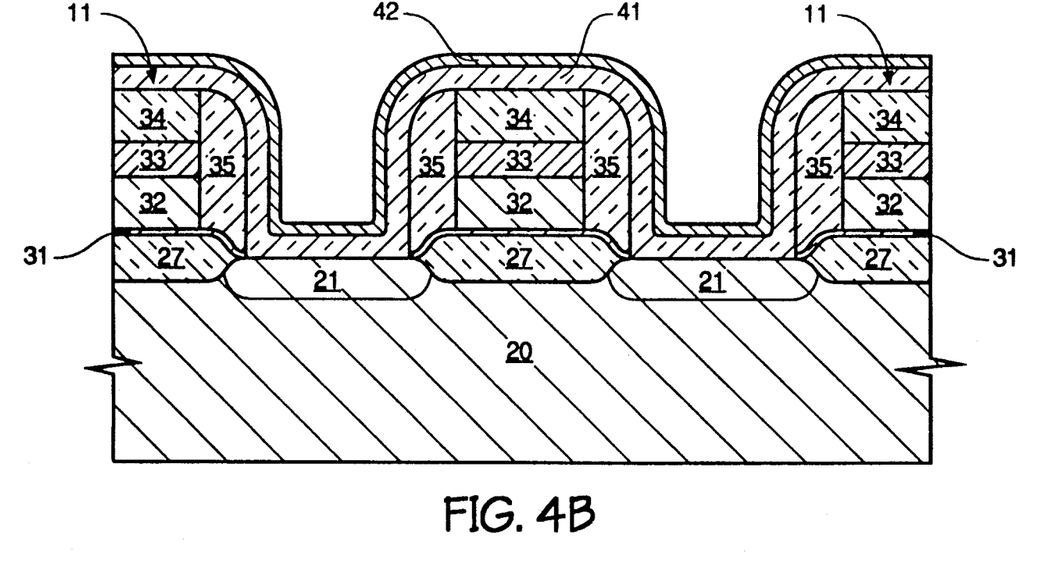
FIG. 4b is a cross-sectional view of the in-process wafer portion of FIG. 3 after conformal depositions of a thin oxide layer and a thin nitride layer, respectively.
Figure 5A:
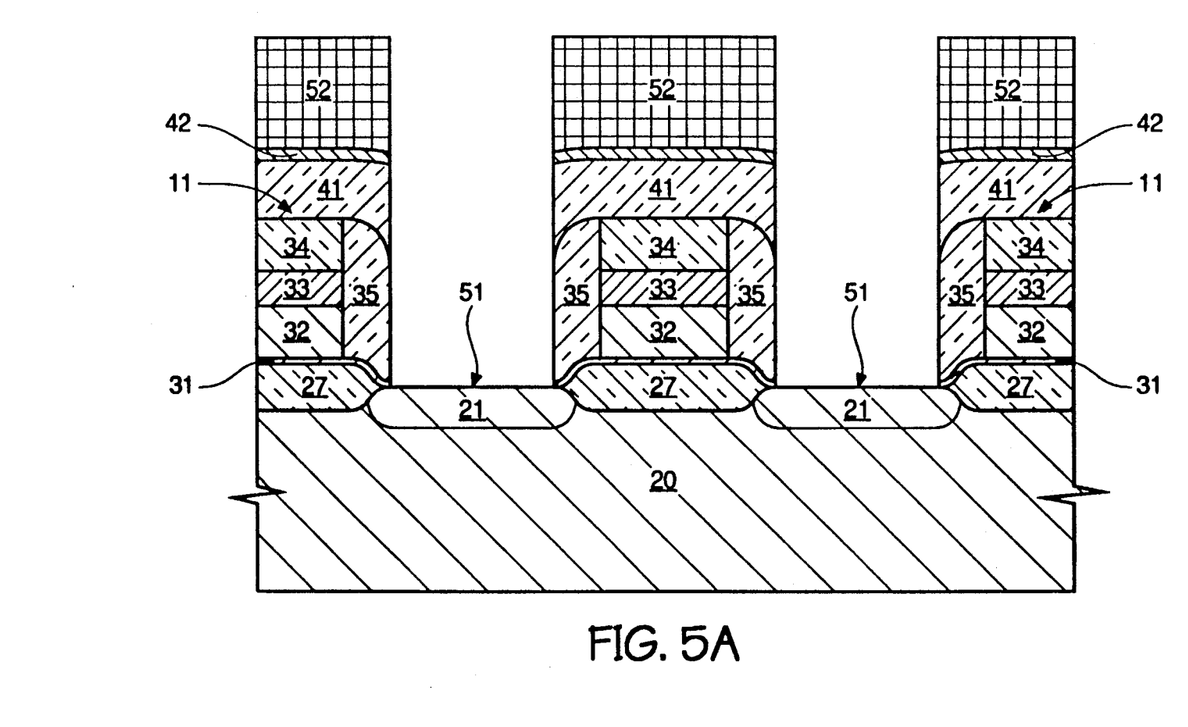
FIG. 5a is a cross-sectional view of the in-process wafer portion of FIG. 4a after patterning and etch of storage node buried contacts.

Alternately, as shown in FIG. 4b, digit lines 11 and their subsequent isolation layers are then covered with a thin layer of oxide 41 at a thickness of 200 to 500 angstroms, preferably by CVD. Following dielectric 41 deposition, a conformal layer of thin nitride 42 is then deposited. The thin oxide is deposited if the process is to incorporate self aligned storage node buried contacts. Otherwise, using thick oxide will require aligning the storage node buried contacts by applying a photoresist and the appropriate mask (as shown in FIG. 5a) to allow a subsequent anisotropic etch to open storage node buried contacts 51.

Figure 5B:
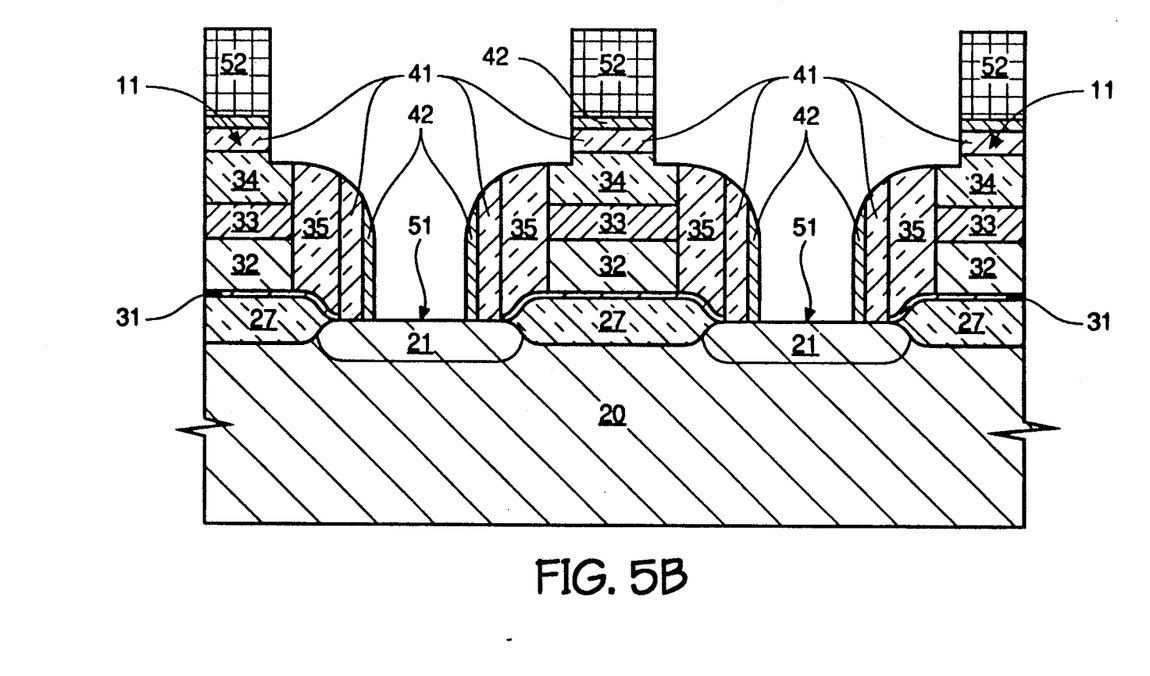
FIG. 5b is a cross-sectional view of the in-process wafer portion of FIG. 4b after patterning and etch of self aligned storage node buried contacts.

In conjunction with FIG. 4b, FIG. 5b shows the formation of self aligned buried contacts 51. Buried contacts 51 are aligned to digit lines 11 by covering all of the wafer surface area with photoresist 52. After applying an appropriate photomask, a buried contact anisotropic etch provides the openings to locate buried contacts 51.

Up to this point, process flow has followed that of an array comprising conventional stacked capacitor cells. From this point forward, the process is unique to an array having DRSC-type storage capacitors. The invention will be described from hereon from FIGS. 6–10 in conjunction with FIGS. 4a and 5a as it is the preferred method. However, if one skilled in the art chooses to use the invention with self aligned storage node buried contacts (developed in FIGS. 4b and 5b) the resultant storage node capacitor will be the same as the one shown in FIG. 10, except that it will possess self aligned storage node buried contacts.

Figure 6:
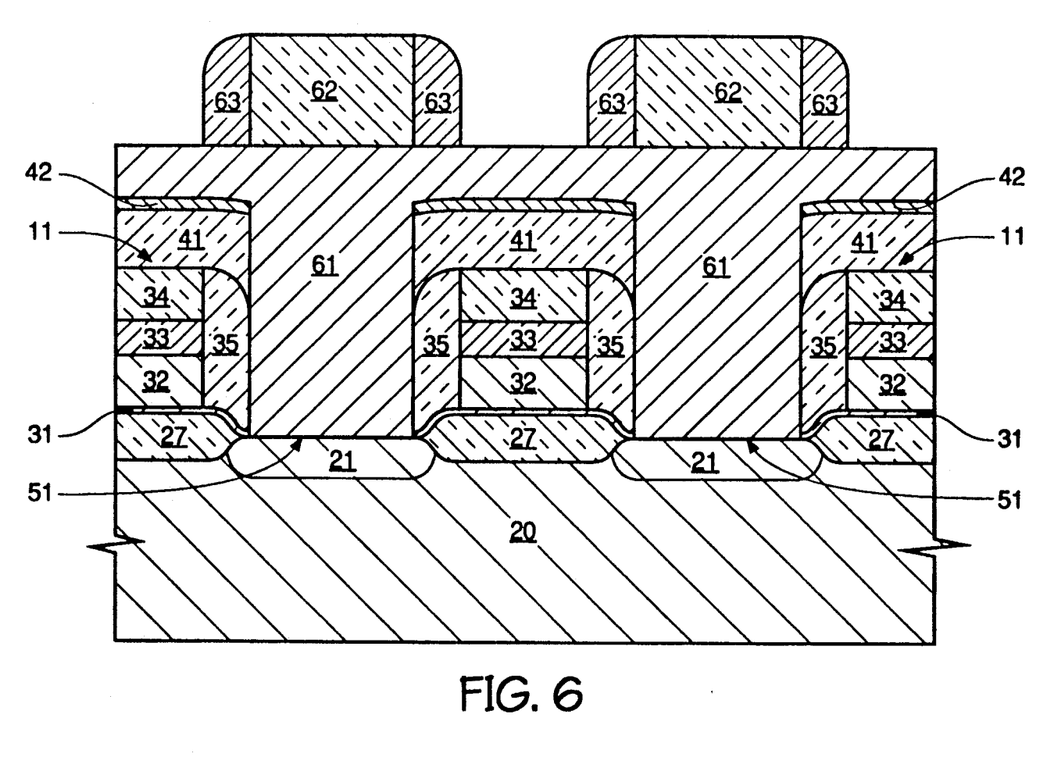
FIG. 6 is a cross-sectional view of the in-process wafer portion of FIG. 5 after a deposition and patterning of a thick oxide followed by a deposition of thin nitride and a nitride space etch.

As shown in FIG. 6, photoresist 52 (of FIG. 5a) has been stripped and a conformal layer of thick polysilicon 61 is deposited thereby connecting to active area 21 via buried contact 51. Thick poly 61 is then etched back to a planarized surface. Following poly 61 planarization, a conformal layer of thick oxide 62 is deposited, preferably by CVD. The height of oxide 62 deposited is controlled as it plays an important role in determining the overall surface area of the DRSC to be completed later in the process. Oxide 62 is patterned into circular shapes thereby leaving oxide 62 aligned, preferably directly over buried contacts 51. Now a thin layer of conformal nitride is deposited followed by an anisotropic etch to form nitride spacers 63.

Figure 7:
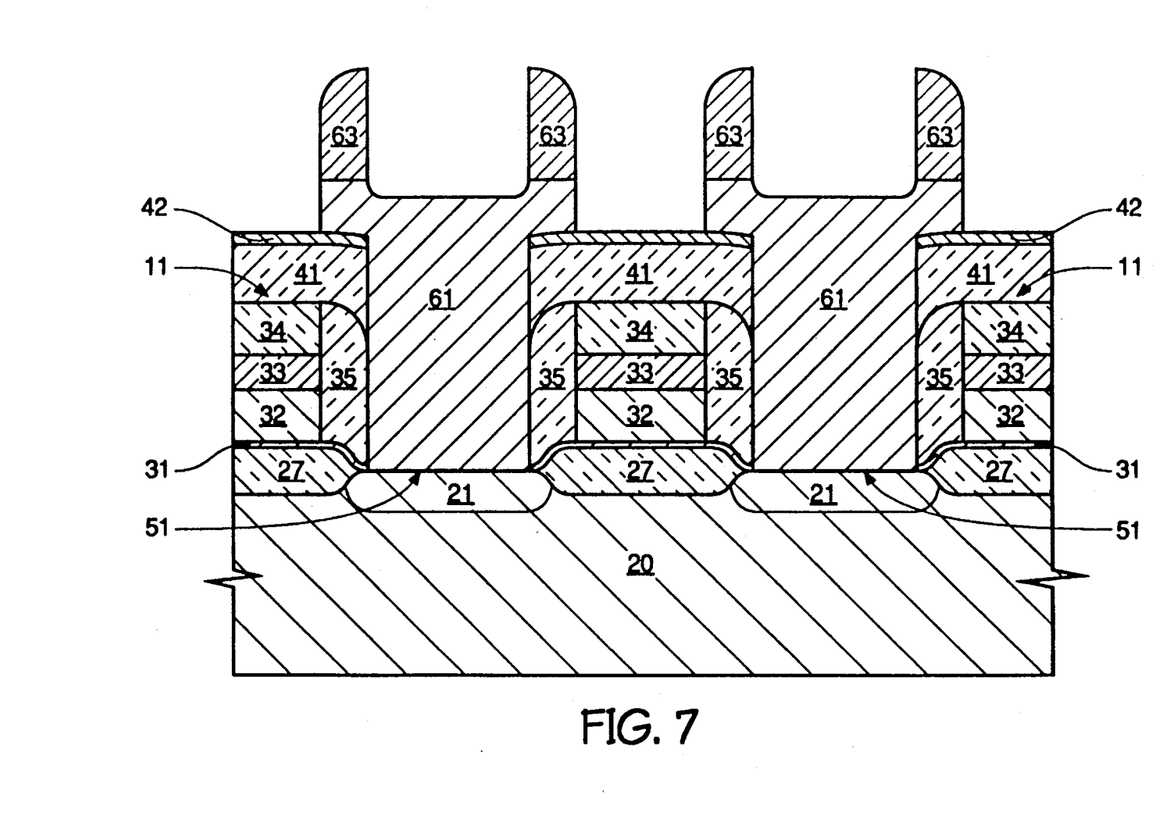
FIG. 7 is a cross-sectional view of an in-process wafer portion of FIG. 6 following a polysilicon dry etch and a wet oxide etch, respectively.

As shown in FIG. 7, a polysilicon dry etch is performed to separate poly 61 into individual poly structures that will eventually become individual storage node plates developed later in the process. Following poly 61 etch, oxide 62 (of FIG. 6) is etched away leaving circular shaped nitride spacers 63 residing vertically on the outer edges of patterned poly 61.

Figure 8:
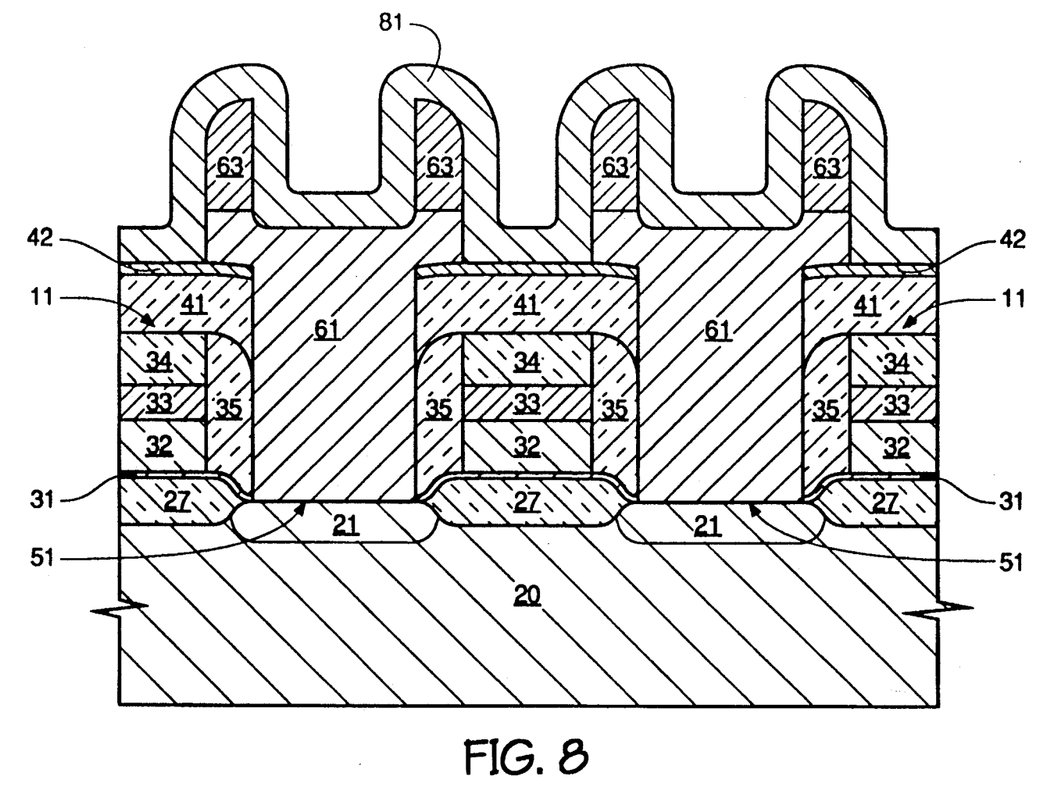
FIG. 8 is a cross-sectional view of the in-process wafer portion of FIG. 7 after a conformal deposition of polysilicon.

As shown in FIG. 8, polysilicon layer 81 is deposited thereby connecting to all exposed areas of polysilicon 61 and enclosing nitride spacers 63.

Figure 9:
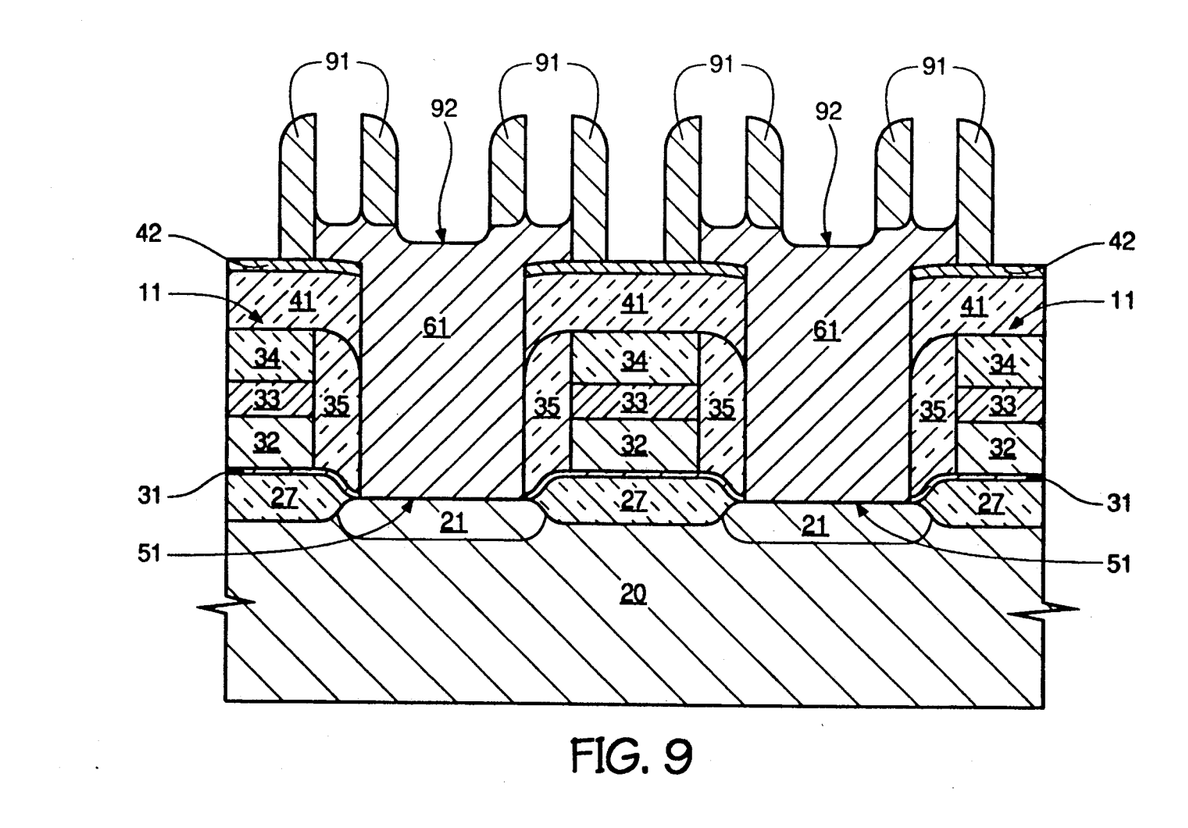
FIG. 9 is a cross-sectional view of the in-process wafer portion of FIG. 8 an anisotropic polysilicon etch, a wet nitride etch and polysilicon doping.

As shown in FIG. 9, a poly anisotropic etch is performed to separate poly 81 to form double ring, poly spacers 91. A wet nitride etch is the performed to remove nitride spacers 63 and nitride 42 (seen in FIG. 8). Poly spacers 91 and patterned poly 61 are conductively doped to the desired conductivity type (p-type or n-type) to become double ring, poly storage node plates 92. As can be seen in this view the height that polysilicon spacers 91 extend upward from polysilicon 61 is determined by the thickness of previously deposited and patterned oxide 62.

Figure 10:
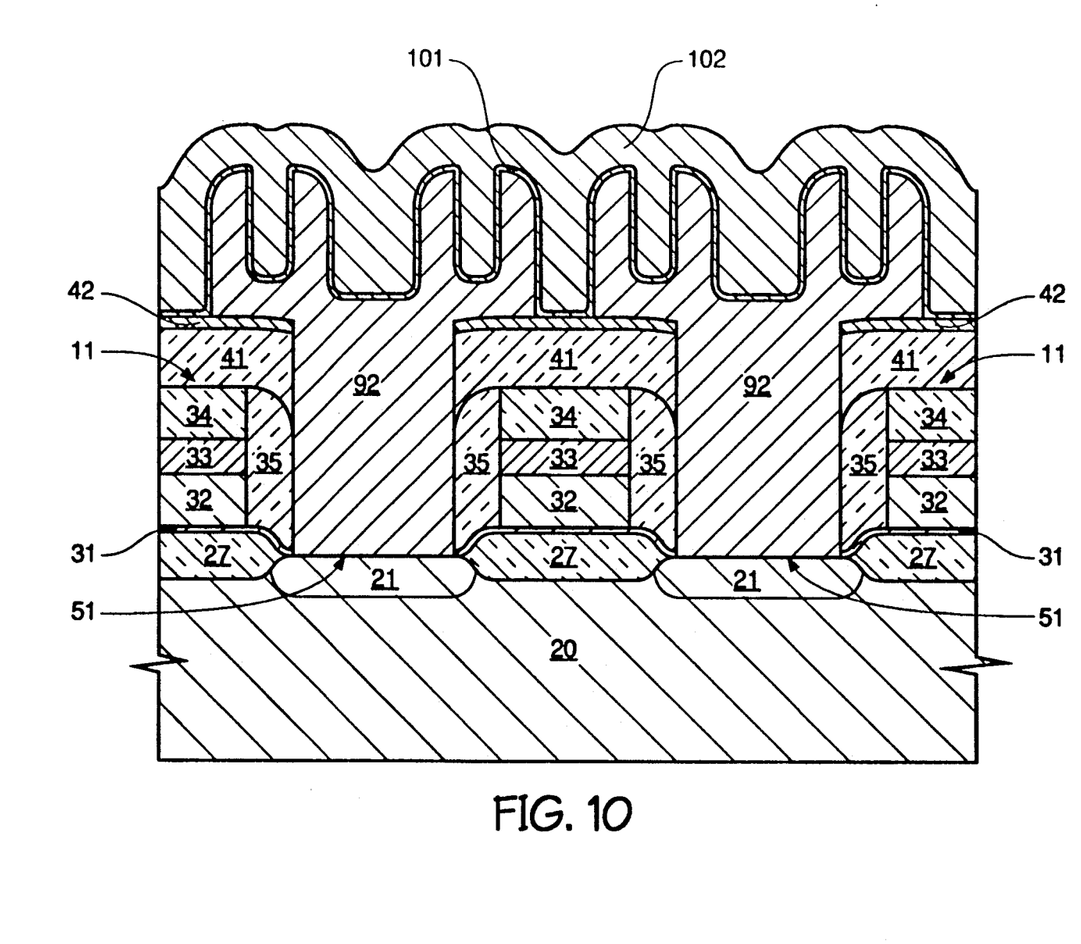
FIG. 10 is a cross-sectional view of the in-process wafer portion FIG. 9 following blanket depositions of conformal cell dielectric and polysilicon, respectively.

As shown in FIG. 10, a dielectric layer of nitride 101 is deposited that conforms to poly storage node plate 92. Nitride 101 serves as a capacitor dielectric for the DRSC. Although nitride 101 is selected as the capacitor dielectric in the preferred embodiment any material having a high dielectric constant such as $Ta_2O_5$ or $SrTiO_3$ could be used. Also, the nitride or $Ta_2O_5$ layers can be oxidized. Following nitride 101 deposition, a blanket deposition of conformal poly 102 is deposited. Poly 102 is conductively doped either n-type or p-type depending on the conductivity type desired for active area 21. Poly 102 now serves as a top poly capacitor cell plate of the DRSC storage capacitor and also becomes a common cell plate to all DRSC storage capacitors in the array. All conformal polysilicon layers used to create the DRSC capacitor are preferably deposited by CVD although other conformal deposition methods could be used as well.

With the unique shape of poly storage node plate 92 along with top poly capacitor cell plate 102 that envelops plate 92, substantial capacitor plate surface area is gained at the storage node. Since capacitance is mainly effected by the surface area of a capacitor's cell plates the additional area gained by a 3-dimensional double ring cell structure can provide an additional 200% or more increase in capacitance over that of a conventional STC capacitor, without more space than that required for defining a stacked capacitor storage cell. Higher density for a given capacitance is possible as a smaller cell area is realized.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM storage capacitor on a silicon substrate having active areas, word lines and digit lines, said process comprising the following sequence of steps:

depositing a first dielectric layer on surface of said silicon, said first dielectric layer conforming to existing topology and comprised of first and second type dielectric materials;

masking and etching aligned buried contact locations allowing access to conductively doped storage node junctions;

depositing a first conductive layer superjacent said array surface thereby assuming said existing topology, said first conductive layer making contact to said storage node junctions at said buried contact locations;

etching back said first conductive layer thereby forming a planarized surface of said first conductive layer;

depositing a second dielectric layer superjacent said first conductive layer;

masking and etching said second dielectric layer thereby forming circular patterned dielectrics aligned directly over said buried contacts;

depositing a third dielectric layer superjacent said circular patterned dielectric and exposed portions of said first conductive layer;

etching said third dielectric layer thereby forming dielectric spacers adjacent said circular patterned dielectrics, said spacer etching re-exposing a portion of said first conductive layer;

etching said circular patterned dielectrics thereby leaving said dielectric spacers residing in a circular fashion adjacent said first conductive layer;

depositing a second conductive layer superjacent said circular fashioned dielectric spacers, said second conductive layer attaching to surface of said re-exposed first conductive layer;

masking and etching said second conductive layer thereby forming double polysilicon ringed storage node plates;

etching said circular fashioned dielectric spacers and said second type dielectric material of said first dielectric layer;

depositing a cell dielectric layer adjacent and coextensive said storage node plates and adjacent said array surface; and depositing a third conductive layer adjacent and coextensive said cell dielectric layer to form a cell plate common to the entire memory array.

2. A process as recited in claim 1, wherein said first, said second, and said third dielectric layers are selected from the group consisting essentially of oxide or nitride.

3. A process as recited in claim 1, wherein said first dielectric layer comprises a layer of thick oxide and thin nitride.

4. A process as recited in claim 1, wherein said first dielectric layer comprises a layer of thin oxide for said first type dielectric material and a layer of thin nitride for said second type dielectric material.

5. A process as recited in claim 1, wherein said second dielectric layer is oxide.

6. A process as recited in claim 1, wherein said third dielectric layer is nitride.

7. A process as recited in claim 1, wherein said buried contacts are self aligned.

8. A process as recited in claim 1, wherein said buried contacts are aligned by a photomask.

9. A process as recited in claim 1, wherein said first, said second, and said third conductive layers are doped polysilicon.

10. A process as recited in claim 9, wherein said doped polysilicon is deposited by chemical vapor deposition.

11. A process as recited in claim 1, wherein said first, said second and said third dielectric layers are deposited by chemical vapor deposition.

12. A process as recited in claim 1, wherein said cell dielectric layer is selected from the group consisting essentially of nitride, oxidized nitride, $Ta_2O_5$, oxidized $Ta_2O_5$ and $SrTiO_3$.

13. A process for fabricating a DRAM array on a silicon substrate, said process comprising the following sequence of steps:

creating a plurality of separately isolated active areas arranged in parallel interdigitated rows and parallel non-interdigitated columns;

creating a gate dielectric layer on top of each active area;

depositing a first conductive layer superjacent surface of said array;

depositing a first dielectric layer superjacent said first conductive layer;

masking and etching said first conductive and said first dielectric layers to form a plurality of parallel conductive word lines aligned along said rows such that each said word line passes over a inner portion of each said active area being separated therefrom by a remanent of said gate dielectric layer;

depositing and etching vertical dielectric spacers adjacent said word lines;

creating of a conductively-doped digit line junction and storage node junction within each said active area on opposite sides of each said word line;

depositing a second dielectric layer superjacent said array surface;

creating a first aligned buried contact location at each said digit line junction in each said active area;

depositing a second conductive layer superjacent said array surface, said second conductive layer making direct contact to said digit line junctions at said first buried contact locations;

depositing a third dielectric layer superjacent said second conductive layer;

masking and etching said second conductive layer and said third dielectric layer to form a plurality of parallel conductive digit lines aligned along said columns such that a digit line makes electrical contact at each digit line junction within a column, said digit lines running perpendicular to and over said word lines forming a 3-dimensional, waveform-like topology;

depositing a fourth dielectric layer superjacent said array surface of said waveform-like topology, said fourth dielectric layer comprised of first and second type dielectric materials;

creating a second aligned buried contact location at each said storage node junction in each said active area;

depositing a third conductive layer superjacent said array surface assuming said waveform-like topology in response to existing topology, said third conductive layer making contact to said storage node junctions at said second buried contact locations;

etching back said third conductive layer thereby forming a planarized surface of said third conductive layer;

depositing a fifth dielectric layer superjacent said third conductive layer;

masking and etching said fifth dielectric layer thereby forming circular patterned dielectrics aligned directly over said second aligned buried contacts;

depositing a sixth dielectric layer superjacent said circular patterned dielectrics and exposed third conductive layer;

etching said sixth dielectric layer thereby forming dielectric spacers adjacent said circular patterned dielectrics, said spacer etching re-exposing a portion of said third conductive layer;

etching said circular patterned dielectrics thereby leaving said dielectric spacers residing in a circular fashion adjacent said third conductive layer;

depositing a fourth conductive layer superjacent said circular fashioned dielectric spacers, said fourth conductive layer attaching to surface of said re-exposed third conductive layer;

masking and etching said fourth conductive layer thereby forming double polysilicon ringed storage nod plates;

etching said dielectric spacers and said second type dielectric material of said fourth dielectric layer;

depositing a cell dielectric layer adjacent and coextensive said storage node plates and adjacent said array surface; and depositing a fifth conductive layer adjacent and coextensive said cell dielectric layer to form a cell plate common to the entire memory array.

14. A process as recited in claim 13, wherein said gate dielectric layer is oxide.

15. A process as recited in claim 13, wherein said first and said second conductive layers comprise a layer of silicide and doped polysilicon.

16. A process as recited in claim 15, wherein said silicide layer is selected from the group consisting essentially of tungsten silicide and titanium silicide.

17. A process as recited in claim 13, wherein said first, said second, said third, said fourth, said fifth and said sixth dielectric layers are selected from the group consisting essentially of oxide or nitride.

18. A process as recited in claim 13, wherein said fourth dielectric layer comprises a layer of thick oxide for said first type dielectric material and thin nitride for said second type dielectric material.

19. A process as recited in claim 13, wherein said fourth dielectric layer comprises a layer of thin oxide and thin nitride.

20. A process as recited in claim 13, wherein said fifth dielectric layer is oxide.

21. A process as recited in claim 13, wherein said sixth dielectric layer is nitride.

22. A process as recited in claim 13, wherein said first and said second buried contacts are self aligned.

23. A process as recited in claim 13, wherein said first buried contact is self aligned and said second buried contacts are aligned by a photomask.

24. A process as recited in claim 13, wherein said third, said fourth and said fifth conductive layers are doped polysilicon.

25. A process as recited in claim 14, wherein said doped polysilicon is deposited by chemical vapor deposition.

26. A process as recited in claim 13, wherein said first, said second, said third, said fourth, said fifth and said sixth dielectric layers are deposited by chemical vapor deposition.

27. A process as recited in claim 13, wherein said cell dielectric layer is selected from the group consisting essentially of nitride, oxidized nitride, $Ta_2O_5$, oxidized $Ta_2O_5$ and $SrTiO_3$.

* * * * *

UNITED STATES PATENT AND TRADEMARK OFFICE
CERTIFICATE OF CORRECTION

PATENT NO. : 5,084,405
DATED : January 28, 1992
INVENTOR(S) : Fazan, et. al.

It is certified that error appears in the above-indentified patent and that said Letters Patent is hereby corrected as shown below:

Column 8, line 14, delete "nod" and insert --node --.

Signed and Sealed this

Twenty-first Day of December, 1993

Attest:

BRUCE LEHMAN

*Attesting Officer*     *Commissioner of Patents and Trademarks*